(12) United States Patent  
Gadamsetty et al.

(10) Patent No.: US 12,094,520 B2  
(45) Date of Patent: Sep. 17, 2024

(54) MEMORY DEVICE LAYOUT WITH INTERSECTING REGION BETWEEN SUB-WORDLINE AND SENSE AMPLIFIER

(71) Applicant: Micron Technology, Inc., Boise, ID (US)

(72) Inventors: Harish Gadamsetty, Allen, TX (US); John A. Winegard, McKinney, TX (US)

(73) Assignee: Micron Technology, Inc., Boise, ID (US)

( * ) Notice: Subject to any disclaimer, the term of this patent is extended or adjusted under 35 U.S.C. 154(b) by 156 days.

(21) Appl. No.: 17/584,905

(22) Filed: Jan. 26, 2022

(65) Prior Publication Data

US 2023/0206991 A1  Jun. 29, 2023

Related U.S. Application Data

(60) Provisional application No. 63/294,522, filed on Dec. 29, 2021.

(51) Int. Cl.
| | | |
|---|---|---|
| *G11C 11/4091* | (2006.01) | |
| *G11C 5/02* | (2006.01) | |
| *G11C 11/4074* | (2006.01) | |
| *G11C 11/408* | (2006.01) | |

(52) U.S. Cl.
CPC .......... *G11C 11/4091* (2013.01); *G11C 5/025* (2013.01); *G11C 11/4074* (2013.01); *G11C 11/4085* (2013.01)

(58) Field of Classification Search
CPC ............ G11C 11/4091; G11C 11/4074; G11C 11/4094; G11C 11/4085; G11C 11/4097; G11C 5/025

See application file for complete search history.

(56) References Cited

U.S. PATENT DOCUMENTS

| | | | |
|---|---|---|---|
| 2012/0236673 A1* | 9/2012 | Kajigaya | G11C 8/08 365/230.06 |
| 2014/0016420 A1* | 1/2014 | Jeong | G11C 7/06 365/207 |
| 2015/0262650 A1* | 9/2015 | Okahiro | G11C 11/4074 365/189.011 |
| 2015/0332740 A1 | 11/2015 | Venkata | |
| 2020/0152249 A1 | 5/2020 | Kawamura | |
| 2020/0176034 A1 | 6/2020 | Kawamura | |
| 2021/0335412 A1 | 10/2021 | He | |

* cited by examiner

*Primary Examiner* — Sultana Begum  
(74) *Attorney, Agent, or Firm* — Fletcher Yoder, P.C.

(57) ABSTRACT

A memory device, includes a memory partition. The memory partition includes a memory region comprising a memory element coupled to a wordline of the memory region, a sense amplifier region comprising a sense amplifier coupled to the memory element to sense a data state of the memory element, a sub-wordline region coupled to the wordline of the memory region, and a minigap region disposed at the intersection of the sub-wordline region and the sense amplifier region. The minigap includes a first plurality of transistors having a continuous layout in at least one direction across the minigap region with a second plurality of transistors of the sense amplifier region.

19 Claims, 5 Drawing Sheets

MEMORY DEVICE LAYOUT WITH INTERSECTING REGION BETWEEN SUB-WORDLINE AND SENSE AMPLIFIER

CROSS REFERENCE TO RELATED APPLICATIONS

This application is a Non-Provisional application claiming priority to U.S. Provisional Patent Application No. 63/294,522, entitled "Memory Device Layout", filed Dec. 29, 2021, which is herein incorporated by reference.

BACKGROUND

Field of the Present Disclosure

Embodiments of the present disclosure relate generally to the field of semiconductor devices. More specifically, embodiments of the present disclosure relate to memory layout techniques and devices.

Description of Related Art

A semiconductor memory device, such as a dynamic random-access memory (DRAM), may store data as bits in memory cells that are implemented using capacitors and transistors. For example, the charge state (e.g., charged or discharged) of a capacitor may determine whether a memory cell stores "1" or "0" as a binary value. Large numbers of memory cells may be packed into the semiconductor memory device, along with additional logic that, for example, enables reading data to, writing data from, and refreshing data in, the memory cells.

However, as the density of memory cells increases, the usable area available for the additional logic utilized in the access of the memory devices is reduced. With this in mind, it is desirable to provide layouts and or circuitry that allows for increased memory density while still allowing for access logic to be present. Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Many electronic systems may employ memory devices to provide data storage functionalities and/or facilitate the performance of data processing operations. Several memory devices may perform storage using electronic memory cells, such as capacitors, flip-flops, latches and/or inverter loops, among others. Examples of memory devices include random access memories (RAMs) devices, dynamic RAM (DRAMs) devices, static RAM (SRAMs) devices, and/or flash memories.

As the memory devices, and their corresponding memory cells, shrink, the sense amplifier and sub-wordline decoder (SWD) regions of the memory devices continue to shrink as well. This reduces available area at the intersection of SWD and sense amplifier (SA) stripe, thus impacting the space for periphery transistors and circuits that is available. Additionally, there is a growing need for additional transistors to be present as activation devices (e.g., power supply devices) and as the memory devices continue to shrink, area becomes less available for these transistors. Accordingly, present embodiments herein describe techniques that utilize the area at the intersection of SWD and SA stripe. For example, this area can be utilized by applying congruent layout geometries as sense amp in the intersection. As a result, significant device area for transistors (e.g., P and N common source pull-up and pull-down devices of the sense amplifier) are provided, increasing the efficiency of the memory device, improving sense margin, providing improved timing of the memory (e.g., tRCD and tCCDL performance), as well as mitigating coupling between bit line to gate of P and N common source pull-up and pull-down devices in the memory. Additional benefits include increased ease of manufacturing as well as reduction of Vt mismatch of sense amplifiers on the edges, since the layout is continuous (e.g., acting as dummy devices).

Figure 1:
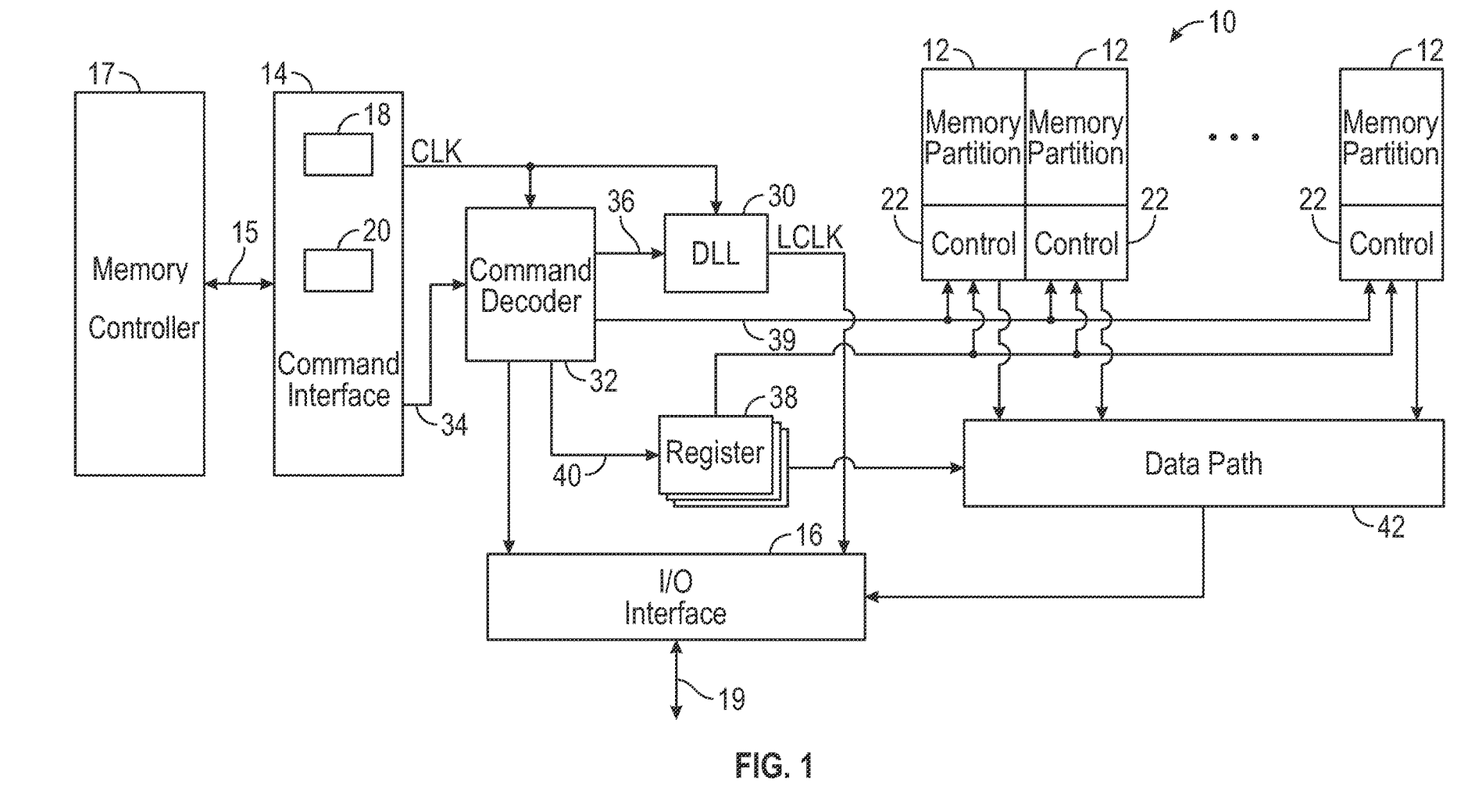
FIG. 1 is a simplified block diagram illustrating certain features of a memory device, according to an embodiment of the present disclosure.

Turning now to the figures, FIG. 1 is a simplified block diagram illustrating certain features of a memory device 10. Specifically, the block diagram of FIG. 1 is a functional block diagram illustrating certain functionality of the memory device 10. In accordance with one embodiment, the memory device 10 may be a random access memory (RAM) device, a dynamic RAM (DRAM) device, a static RAM (SRAM) device, including a double data rate SRAM device, such as a double data rate type four synchronous dynamic random access memory (DDR4 SDRAM), a device double data rate type five synchronous dynamic random access memory (DDR5 SDRAM), a double data rate type six synchronous dynamic random access memory (DDR6 SDRAM), flash memory, other types of DRAM, mobile RAM, etc. or other memory, such as and/or a phase change memory (PCM) device and/or other chalcogenide-based memory, such as self-selecting memories (SSM).

The memory device 10 may include a number of memory partitions 12 each inclusive of one or more arrays (i.e., memory arrays). Various configurations, organizations, and sizes of the memory partitions 12 on the memory device 10 may be utilized depending on the application and design of the overall system. For example, the when utilized in conjunction with DDR5 SDRAM, the memory partitions 12 may be memory banks provided on one or more chips (e.g., SDRAM chips) that are arranged on dual inline memory modules (DIMMS). Each DIMM may include a number of SDRAM memory chips (e.g., ×4, ×8, or ×16 memory chips), as will be appreciated whereby each SDRAM memory chip may include one or more memory banks. Various other configurations, organization and sizes of the memory partitions 12 on the memory device 10 may be utilized depending on the application and design of the overall system.

The memory device 10 may also include a command interface 14 and an input/output (I/O) interface 16. The command interface 14 is configured to provide a number of signals from an external device, such as a processor or controller (e.g., memory controller 17) external to the memory device 10. In some embodiments, a bus 15 (or a signal path or another group of signal paths) may, individually or in combination, allow for bidirectional transmission of signals between the command interface 14 and the processor or controller (e.g., the memory controller 17). Likewise, a bus 19 (or a signal path or another group of signal paths) may, individually or in combination, allow for bidirectional transmission of signals, including, for example, data signals, between the I/O interface 16 and, for example, the processor or controller (e.g., the memory controller 17). Thus, the processor or controller, for example, the memory controller 17 may provide various signals to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the received signals. The command interface 14 may receive one or more clock signals from an external device, such as a processor or controller (for example, the memory controller 17). Likewise, the command interface receives commands (e.g., read command, write command, etc.), which may be entered on the positive edges of the clock signal, as well as data, which typically is transmitted or received on both positive and negative clock edges. In some embodiments, the commands can be of a variable clock length (e.g., one or more clocks are used to receive the commands).

The clock input circuit 18 receives the one or more clock signals and generates an internal clock signal CLK therefrom. In some embodiments, the internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The phase controlled internal clock signal LCLK may be used to clock data through the I/O interface 16, for instance.

Further, the command decoder 32 may decode commands, such as read commands, write commands, register set commands, activate commands, etc., and provide access to a particular memory partition 12 corresponding to the command, via bus path 39. The command decoder 32 may also transmit various signals to one or more registers 38 via, for example, bus path (e.g., one or more global wiring lines 40). As will be appreciated, the memory device 10 may include various other decoders, such as row decoders and column decoders, to facilitate access to the memory partitions 12. In one embodiment, each memory partition 12 includes a control block 22 which provides the necessary decoding (e.g., row decoder and column decoder), as well as other features, such as timing control and data control, to facilitate the execution of commands to and from the memory partitions 12.

In certain embodiments, the command decoder 32 or other component in the memory device 10 may provide register commands to the one or more registers 38, which may be utilized in operations of each memory partition 12, each control block 22 (or partition controller therein), and the like. For example, one of the one or more registers 38 may operate to define various modes of programmable operations and/or configurations of the memory device 10. Registers 38 can be included in semiconductor devices to define operations for various types of memory components, such as DRAM, synchronous DRAM, chalcogenide memories (e.g., PCM) or other types of memories. The one or more registers 38 may receive various signals from the command decoder 32 or the like via global wiring lines 40. The global wiring lines 40 may include a common data path, a common address path, a common write command signal path, and a common read command signal path. The global wiring lines 40 may traverse across the memory device 10, such that each register 38 may couple to the global wiring lines 40. The additional registers may involve additional wiring across the semiconductor device (e.g., die), such that the registers are communicatively coupled to the corresponding memory components.

The one or more registers 38 operate as an example of registers that, when in operation, are accessed or otherwise accessible by the memory controller 17. The registers accessible by the memory controller 17 can be dispersed across the memory device 10 and the these registers can represent or contain information such as configuration settings of the memory device 10 and/or specific components therein, status of the memory device 10 and/or specific components therein, memory device 10 parameters and/or specific parameters for components of the memory device 10, as well as predetermined patterns that can be written across the memory device (e.g., in one or more of the memory partitions 12). Thus, while the one or more registers 38 is illustrated in FIG. 1, it should be appreciated that additional and/or alternative registers are located in the memory device and these registers are accessible by the memory controller 17 (i.e., when in operation, the registers are accessed by the memory controller 17). These accesses by the memory controller 17 may include, for example, reads of the registers (e.g., read accesses) and/or writes to the registers (e.g., write accesses).

The memory device 10 executes operations, such as read commands and write commands, based on the command/address signals received from an external device, such as a processor and/or by the memory controller 17. In one embodiment, command/address signals are clocked to the command interface 14 using clock signals. The command interface may include a command address input circuit 20 which is configured to receive and transmit the commands to provide access to the memory partitions 12, through the command decoder 32, for instance. In addition, the command interface 14 may receive memory select signals that enable the memory device 10 to process commands on the incoming command/address signals. Access to specific memory partitions 12 within the memory device 10 can be encoded in the commands.

In addition, the command interface 14 may be configured to receive a number of other command signals. For instance, a reset command may be used to reset the command interface 14, status registers, state machines and the like, during power-up for instance. Various signals to facilitate testing of the memory device 10 may be provided, as well. For instance, the testing signals may be used to place the memory device 10 into a test mode for connectivity testing. The command interface 14 may also be used to provide an alert signal or another alarm signal to the system processor or controller for certain errors that may be detected. However, in some embodiments, the I/O interface 16 may additionally or alternatively be utilized to transmit an alert signal, for example, a thermal alert.

Data may be sent to and from the memory device 10, utilizing the command and clocking signals discussed above, by transmitting and receiving data signals through the I/O interface 16. More specifically, the data may be sent to or retrieved from the memory partitions 12 over the data path 42, which includes a plurality of bi-directional data buses. Data I/O signals, are generally transmitted and received in one or more bi-directional data busses to and from the I/O interface 16. For certain memory devices, such as a DDR5 SDRAM memory device, the I/O signals may be divided into upper and lower bytes; however, such segmentation is not required for other memory device types.

As will be appreciated, various other components such as power supply circuits (for receiving external VDD and VSS signals), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
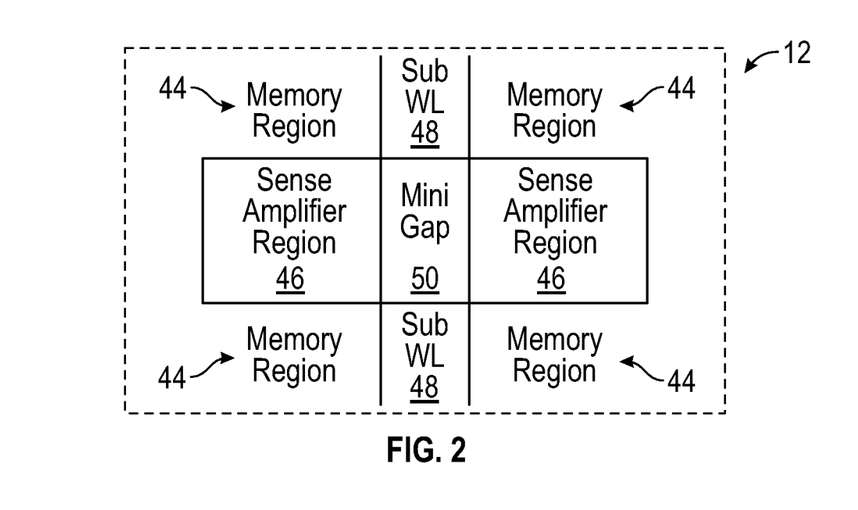
FIG. 2 is a block diagram of a portion of a memory partition of the memory device of FIG. 1, according to an embodiment of the present disclosure.

FIG. 2 illustrates a portion of the memory partition 12. More particularly, FIG. 2 illustrates memory regions 44, sense amplifier regions 46, sub-wordline regions 48 (e.g., sub-wordline decoder (SWD) regions), and a minigap region 50 disposed at the intersection of the sense amplifier regions 46 and the sub-wordline regions 48. The memory regions 44 may be representative of memory cell arrays that each include a plurality of word lines, a plurality of bit lines, and a plurality of memory cells arranged at intersections of the plurality of word lines and the plurality of bit lines, Selection of a word line can be performed by a row decoder and the selection of a bit line can be performed by a column decoder. Sense amplifiers are present in the sense amplifier regions 46 and are respectively coupled to corresponding bit lines as well as connected to local input/output (I/O) line pairs LILT/B, as described below in greater detail with respect to FIG. 3.

Figure 3:
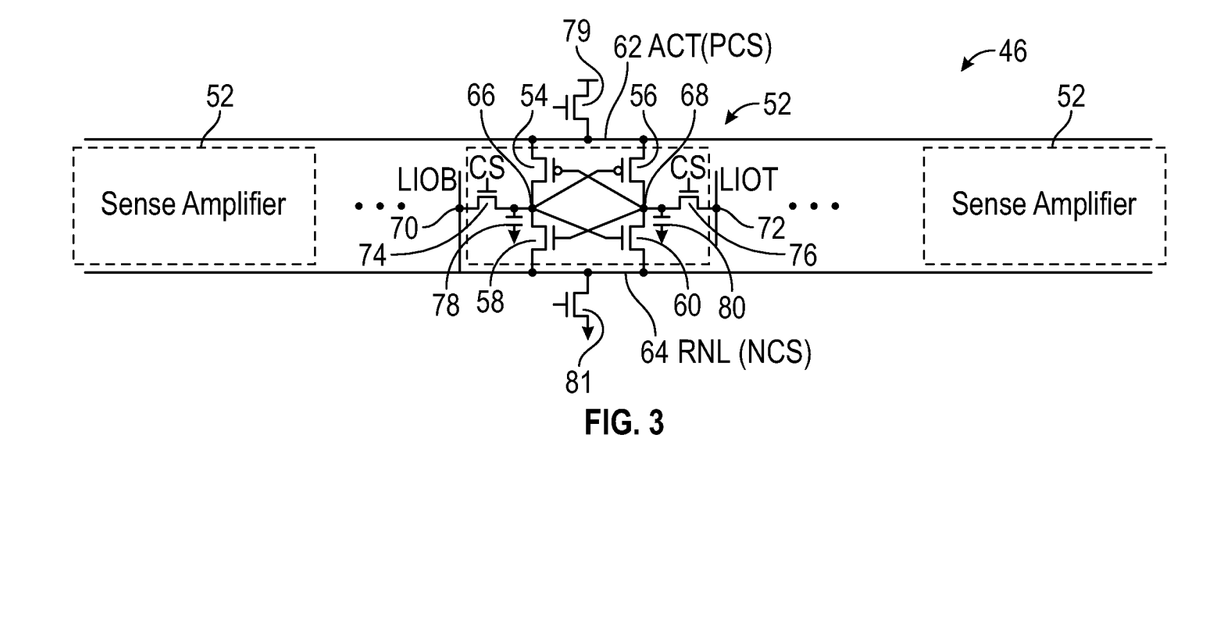
FIG. 3 is a schematic diagram of a portion of a sense amplifier region of FIG. 2, according to an embodiment of the present disclosure.

FIG. 3 illustrates a circuit diagram of a sense amplifier 52 of the sense amplifier region 46. As illustrated, the sense amplifier 52 includes transistor 54 and transistor 56, which may be, for example, p-type transistors that are coupled (via their drains) to transistor 58 and transistor 60, which may be, for example, n-type transistors. Transistors 54 and 56 and transistors 58 and 60, as illustrated, are each cross coupled as an inverter configuration in which a first inverter includes transistors 54 and 58 while the second inverter includes transistors 56 and 60. As illustrated, transistors 54 and 56 are coupled to a P-sense (PCS) amplifier control line 62 (e.g., a line that receives an activation signal, ACT), which operates to provide a supply voltage at an active (e.g., high) level. Likewise, transistors 58 and 60 may be coupled to an N-sense (NCS) amplifier control line 64 (e.g., a line that recites a row N-sense latch signal, RNL) which provides a reference voltage (e.g., a ground voltage) at an active (e.g., low level). The sense amplifier 52 when in operation senses and amplifies a data state applied to sense node 66 and sense node 68. In some embodiments, sense node 66 can be coupled to a digit (or bit) line Db to receive a reference value or reference digit while sense node 68 can be coupled to a digit (or bit) line Da to receive a target digit value (e.g., a 1 as a logic high or a 0 as a logic low).

The sense nodes 66 and 68 may be respectively coupled to local input/output node B (LIOB) 70 (e.g., LIO Bar) and local input/output node T (LIOT) 72 (e.g., LIO true) through transistors 74 and 76. Transistors 74 and 76 may be activated when a column select (CS) signal is active. Furthermore, in some embodiments, equalization circuitry (including transistors) may be present in the minigap region 50 and utilized to pre-charge the LIOB 70 and the LIOT 72 prior to reception of any CS signal. Local I/O lines are also coupled to the LIOB 70 and the LIOT 72 and are shared across multiple sense amplifiers 52 (e.g., across multiple sense amplifiers 52 aligned with columns of the memory cells of the memory regions 44). Additionally, capacitors 78 and 80 may be present to operate as filters for the sense amplifier 52. Furthermore, transistor 79 may operate as a supply (e.g., power supply) to the sense amplifier 52 and may be coupled to the PCS amplifier control line 62 while transistor 81 is coupled to ground as well the NCS amplifier control line 64.

In operation, the sense amplifier 52 may sense a data state of a coupled memory cell on the digit lines Da and Db in response to received control signals (e.g., the ACT, the RNL, and the CS signal). The control signals may be provided by a decoder circuit, such as any of a command decoder, a row decoder, a column decoder, memory array control circuitry (e.g., the control circuitry of the memory cell array of the memory partitions 12), or any combination thereof. A sense operation may include an initial pre-charge phase and a sense phase.

During the initial pre-charge phase of a sense operation, the sense nodes 66 and 68 may be pre-charged to a predetermined voltage. At the end of the initial pre-charge phase and/or at the start of the sense phase, a word line associated with the sense operation may be set to an active state. During the sense phase, the sense amplifier 52 may sense a data state of memory cell coupled to the digit line Da or Db. After activation of the word line, the ACT signal is active (set to a logic high) and the RNL signal is active (set to a logic low).

During the sense phase, sense and amplify operations are performed. For example, in response to a memory cell being coupled to digit line Da or Db through its respective access device, a voltage difference is created between the digit lines Da and Db. The voltage difference is sensed by transistors 58 and 60 as the sources of transistors 58 and 60 are pulled to ground through the activated RNL signal. This process occurs since one of the transistors 58 and 60 with its gate coupled to the respective digit line Da or Db receives a slightly higher voltage at its gate. For example, when a memory cell coupled to sense node 66 via the digit line Db stores a high data state, the transistor 60 begins conduct. Likewise, transistor 58 may become less conductive as the voltage of the sense node 68 with the slightly lower voltage decreases through the conducting transistor 60. The differences in the higher and lower voltages are amplified to represent logic high and logic low voltages.

After the data state of the memory cell is sensed, and the sense nodes 66 and 68 are each pulled to a respective one of the ACT signal and RNL signal voltages, a read may be performed in response to a READ command. For example, the CS signal may be activated (e.g., in response to the READ command), the digit lines Da and Db (e.g., at sense nodes 68 and 66) may be coupled to the LIO nodes (LIOB 70 and LIOT 72) and the data output may be provided to the LIO nodes. In this manner, the data may be read out from the LIO nodes LIOB 70 and LIOT 72. After a read operation is completed, the CS signal may be set to an inactive state. This process may be repeated for a subsequent operation (e.g., a subsequent READ operation).

Returning to FIG. 2, the sub-wordline regions 48 may include one or more buffers (e.g., word line decoders) that can provide predetermined delays for corresponding word lines of the memory regions 44. The proximity of the one or more buffers allow for localized control over the respective word lines in the corresponding memory regions 44. As further illustrated, the minigap region 50 is positioned at the intersection of the sense amplifier regions 46 and the sub-wordline regions 48. In one embodiment, the minigap region 50 may include periphery circuitry, for example, circuitry used in conjunction with the operation of the sense amplifier 52. One embodiment of a layout of the sense amplifier regions 46 and the minigap region 50 of FIG. 2 is presented in FIG. 4.

Figure 4:
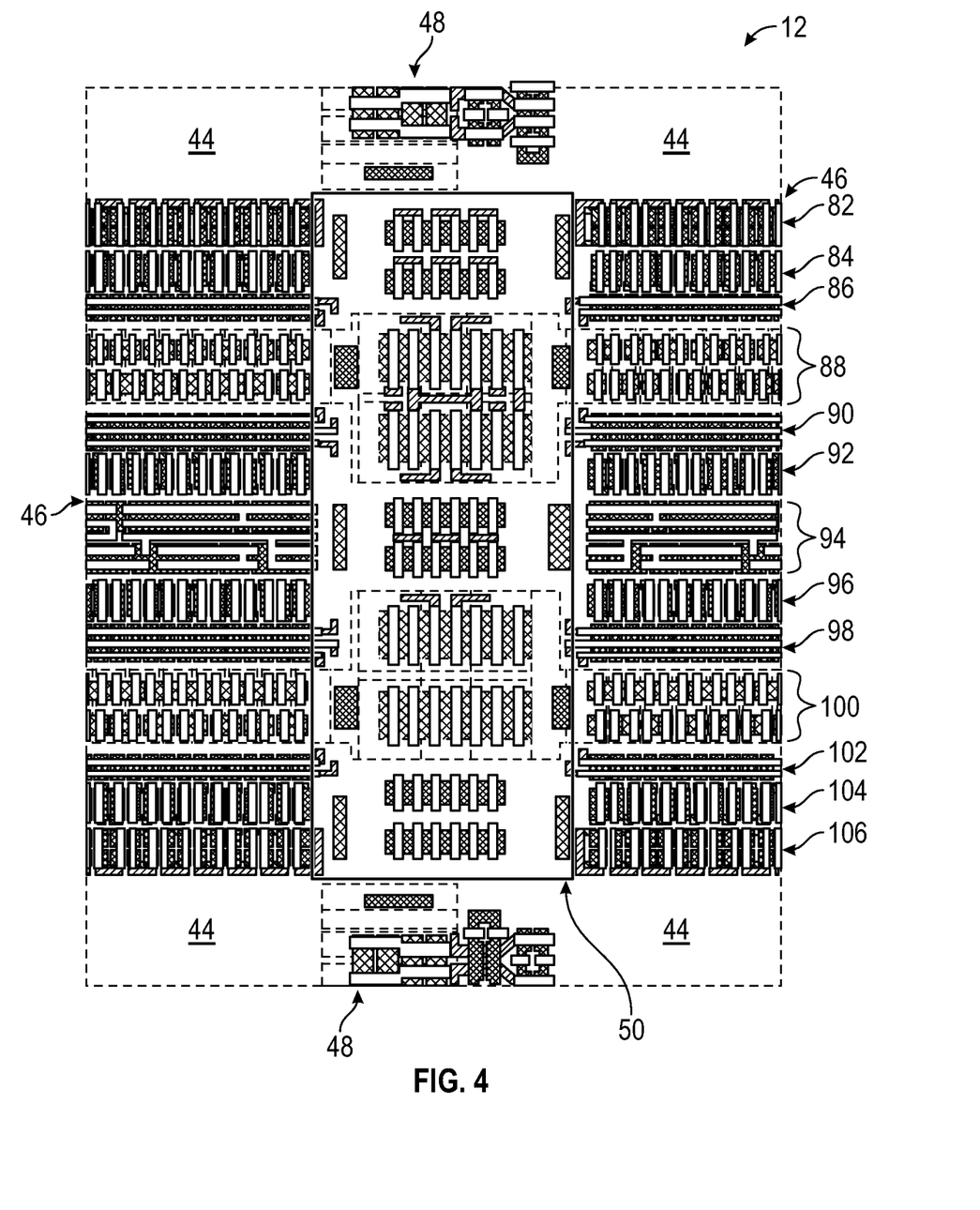
FIG. 4 is a circuit diagram of the portion of the memory partition of FIG. 2, according to an embodiment of the present disclosure.

FIG. 4 illustrates a layout diagram of a portion of the memory partition 12. As illustrated, the sense amplifier regions 46 include a plurality of transistors laid out according to a first set of pitch rules, which govern, for example, one or more of the density of the transistors, the types of transistors used, the connections of the transistors, the metallization of the region, gate to contact spacing, contact landing pad sizes, transistor widths, interconnect width spacing, etc. Likewise, the minigap region 50 includes transistors laid out according to a second set of pitch rules that differ from those applied in the sense amplifier region 46 (as well as those applied in the sub-wordline regions 48). The differences in the transistors of the sense amplifier region 46 and the minigap region 50 are apparent as having different sizes from one another indeed, the transistors of minigap region 50 and the transistors of the sense amplifier regions 46 are different types of transistors.

Moreover, the sense amplifier regions 46 may include sub-regions 82, 84, 86, 88, 90, 92, 94, 96, 98, 100, 102, 104, and 106 that can operate to provide and/or transmit respective signals, for example, to the sense amplifiers 52 of the sense amplifier regions 46. For example, sub-regions 82 and 106 may include the transistors 74 and 76 that receive the CS signal (e.g., CS transistors). Similarly, sub-regions 84, 92, 96, and 104 may include N-type transistors, such as transistors 58 and 60 while sub-regions 88 and 100 may include P-type transistors, such as transistors 54 and 56. Sub-regions 86, 90, 98, and 102 may include transistors used in equalization to insure equal voltage levels between two nodes, while sub-region 94 includes transistors utilized in providing read write signals.

As illustrated, the circuitry, including transistors, of the minigap region 50 are aligned using different pitch rules than those applied in the sense amplifier regions 46 (as well as the sub-wordline regions 48). As the memory cells of the memory regions 44 shrink (i.e., to include more memory cells in a given memory region) and/or as the die size of the memory device 10 is reduced, the size of the sense amplifier regions 46 and the sub-wordline regions 48 are also reduced. This renders it difficult to include the same number transistors in the minigap region 50 relative to the number of transistors illustrated, for example, in FIG. 4.

Additionally, the minigap region 50 can include local I/O equalization circuitry to insure equal voltage levels between, for example, the LIOB 70 and the LIOT 72, as well as, for example, local I/O cross-couple pull up devices. However, while the minigap region 50 includes equalization circuitry to equalize voltages for the sense amplifiers 52, the minigap region 50 is typically insufficiently sized to also include activation circuitry, e.g., transistors 79 and 81, as power supply devices, Instead, for example, the activation circuitry, e.g., transistors 79 and 81, as power supply devices would be present across the sense amplifier regions 46. Moreover, the circuits that are present in the minigap region 50 of FIG. 4 are arranged in a manner that differs from the layouts of both the sense amplifier regions 46 and the sub-wordline regions 48. However, FIG. 5 illustrates an example of another embodiment of a portion of a memory partition 12 illustrating the above discussed sense amplifier regions 46 and sub-wordline regions 48, as well as a minigap region 108 that differs from the minigap region 50 of FIGS. 2 and 4.

Figure 5:
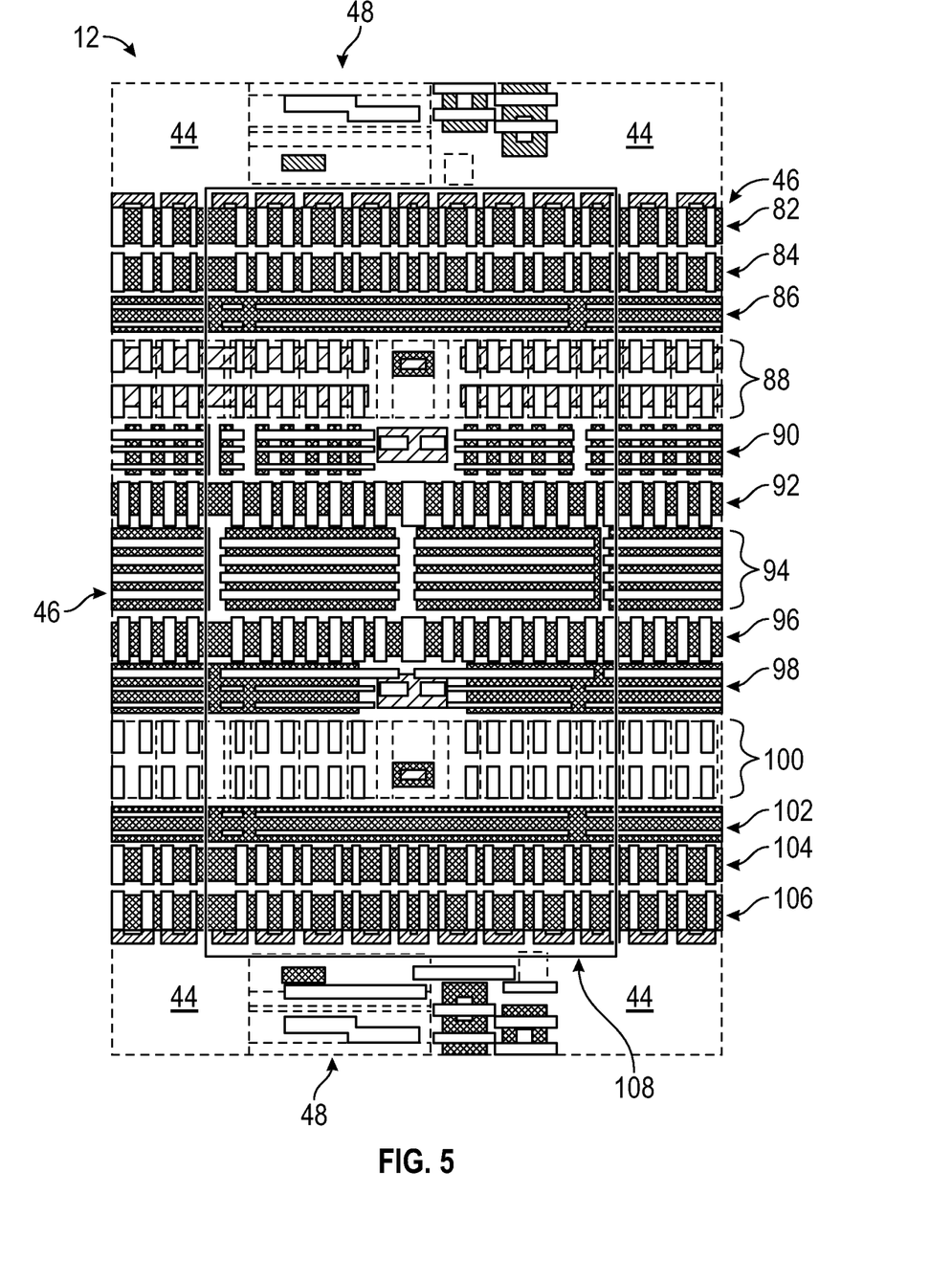
FIG. 5 is a circuit diagram of a second embodiment of a portion of the memory partition of FIG. 1, according to an embodiment of the present disclosure.

FIG. 5 illustrates a layout diagram of a portion of the memory partition 12. As illustrated, the sense amplifier regions 46 include a plurality of transistors laid out according to a first set of pitch rules, which govern, for example, the density of the transistors, the types of transistors used, the connections of the transistors, the metallization of the region, etc. Likewise, the minigap region 108 includes transistors laid out according to the first set of pitch rules applied in the sense amplifier region 46. This allows for an increase in the number of transistors present in the minigap region 108. These additional transistors allow for the inclusion of activation circuits e.g., transistors 79 and 81, as power supply devices for the sense amplifiers 52 in the sense amplifier regions 46 in addition to the local I/O equalization circuitry and local I/O cross-couple pull up devices of minigap region 50 of FIGS. 2 and 4. The differences in the transistors of minigap region 50 of FIGS. 2 and 4 and the transistors of minigap region 108 are apparent as having different sizes from one another and indeed, the transistors of minigap region 50 and the transistors of minigap region 108 are different types of transistors. Instead, the transistors of the minigap region 108 are aligned in at least one direction with transistors of the sense amplifier regions 46. Moreover, there is a reduced amount of space in the minigap region 108 relative to the minigap region 50 in which no transistors are present.

Figure 6:
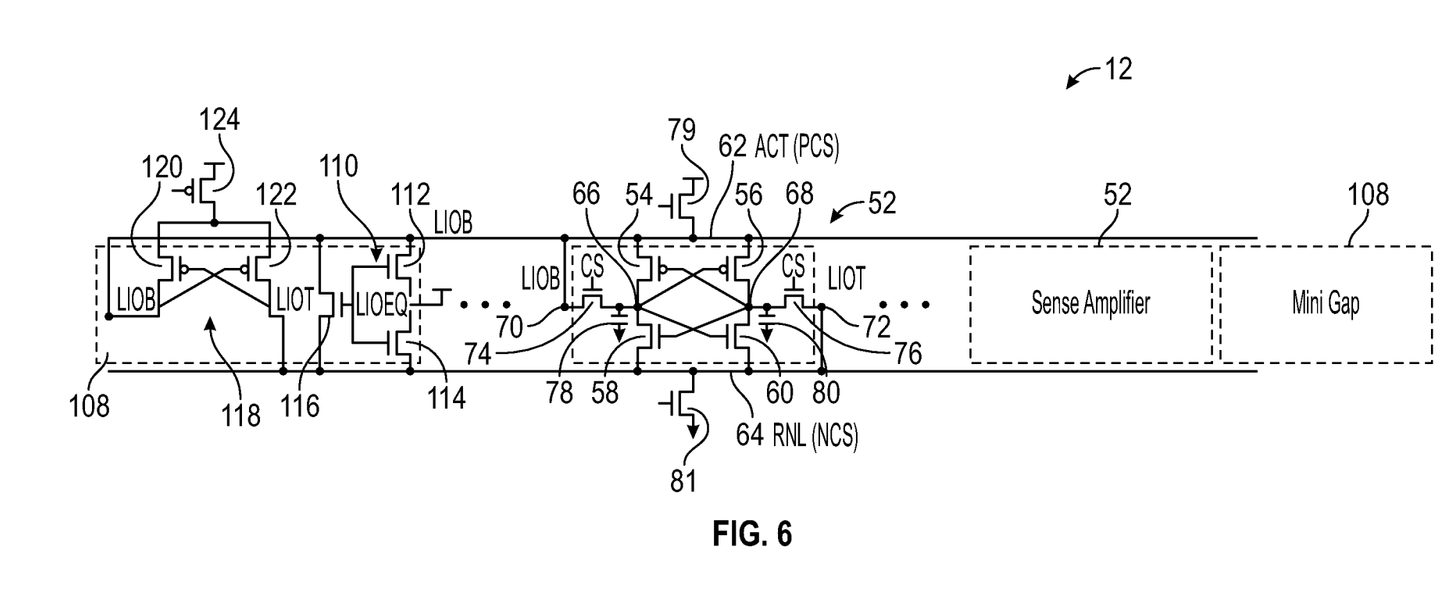
FIG. 6 is a schematic diagram of illustrating a portion of a sense amplifier region and a minigap region of the portion of the memory partition of FIG. 5, according to an embodiment of the present disclosure.

In short, the transistor layout of the sense amplifier regions 46 are copied into the minigap region 50 such that the transistor layout in at least one direction (e.g., horizontally across the minigap region 108) are continuous. The additional transistors present in the minigap region 108 relative to minigap region 50 may allow for activation circuitry as well as equalization circuitry (including transistors) to be present in the minigap region 50 and utilized to pre-charge the LIOB 70 and the LIOT 72 prior to reception of any CS signal. FIG. 6 illustrates an example of the minigap region 108 inclusive of both activation circuitry and equalization circuitry.

FIG. 6 illustrates a circuit diagram of a portion of the memory partition 12 inclusive of a sense amplifier 52 of the sense amplifier region 46 and a portion of the minigap region 108. As illustrated, the sense amplifier 52 is similar to the sense amplifier 52 of FIG. 3. However, the included activation circuitry, e.g., transistors 79 and 81, as power supply devices, while illustrated as being coupled to the sense amplifier 52, may be located in the minigap region 108. Likewise, the portion of the minigap region 108 includes equalization circuitry 110 (including transistor 112, transistor 114, and transistor 116) as well as amplification circuitry 118 (including transistor 120 and transistor 122) and transistor 124 that supplies power to the amplification circuitry 118. In some embodiments, similar to transistors 79 and 81, transistor 124 operates as activation circuitry and may be located in the minigap region 108. The equalization circuitry 110 may be a 3-gate equalizer that operates to provide a voltage split to the LIOB 70 and the LIOT 72, which may be used to pre-charge the LIOB 70 and the LIOT 72 prior to reception of any CS signal. Likewise, the amplification circuitry 118 may operate to amplify the read data from the sense amplifier 52. In this manner, the minigap region 108 allows for both LIO equalization and data amplification.

Returning to FIG. 5, the minigap region 108, by including additional transistors relative to minigap region 50, allow for not only equalization circuitry that can be used in equalization of the data as well equalization of the sense circuitry and operation, but also the activation circuitry for the sense amplifiers 52 and the amplification circuitry 118. Moreover, as the transistor layout of the sense amplifier regions 46 are copied into the minigap region 50 such that the transistor layout in at least one direction (e.g., horizontally across the minigap region 108) are continuous, the types of transistors used in the sense amplifier regions 46 are the same types of transistors used in the minigap region 108. However, since the transistors in the minigap 108 are in different locations and are of different types than the transistors in the minigap region 50, the transistors of the minigap region 108 may be set-up (e.g., configured, connected, or otherwise mapped) differently than the transistors of the minigap region 50 according to the pitch rule of the sense amplifier regions 46.

For example, as previously discussed, the sense amplifier regions 46 may include sub-regions 82, 84, 86, 88, 90, 92, 94, 96, 98, 100, 102, 104, and 106 that can operate to provide and/or transmit respective signals, for example, to the sense amplifiers 52 of the sense amplifier regions 46. However, as the transistors of the minigap region 108 do not operate in the manner of the transistors of the sense amplifier regions 46, the transistors of the minigap region 108 in line with sub-regions 82, 84, 86, 88, 90, 92, 94, 96, 98, 100, 102, 104, and 106 (e.g., horizontally aligned with sub-regions 82, 84, 86, 88, 90, 92, 94, 96, 98, 100, 102, 104, and 106) can be set-up to operate differently from the transistors of the sub-regions 82, 84, 86, 88, 90, 92, 94, 96, 98, 100, 102, 104, and 106, even though the transistor layout in at least one direction (e.g., horizontally across the minigap region 108) are continuous.

For example, sub-regions 82 and 106 of the sense amplifier regions 46 may include the transistors 74 and 76 that receive the CS signal (e.g., CS transistors) while the regions in the minigap region 108 that extend in a direction and include transistors similar to those in the sub-regions 82 and 106 may be used as the LIO equalization transistors of the equalization circuitry 110 (e.g., transistors 112, 114, and 116). Similarly, sub-regions 88 and 100 may include P-type transistors, such as transistors 54 and 56, in the sense amplifier regions 46 while the regions in the minigap region 108 that extend in a direction and include transistors similar to those in the sub-regions 88 and 100 may be used as the LIO cross coupled transistors 120 and 122 of the amplification circuitry 118. Likewise, the regions in the minigap region 108 that extend in a direction and include transistors similar to those in the sub-regions 84, 86, 90, 92, 94, 96, 98, 102, and 104 of the sense amplifier regions 46 may be used as the activation transistors (e.g., transistors 79, 81, and 124). Thus, it is apparent that the reconfiguration of the minigap region 108 to include common transistors with the sense amplifier regions 46 across the minigap region 108 along one direction provides additional transistors that can utilized as power supply devices to power activation of the LIO cross coupled transistors 120 and 122 of the amplification circuitry 118 as well as the sense amplifier 52. It should be noted that the transistors 79, 81, and 124 (e.g., activation circuitry as power supply devices) may be disposed in the minigap region 50 and that including greater numbers of transistors 79, 81, and 124 that can be disposed in the minigap region 108 provides advantageous increases in the speed of the operation of memory device 10.

In some embodiments, inclusion of the minigap region 108 as described herein provides better sense margin (e.g., to allow for reading of degraded memory cells), increased rates of activation of the columns of the memory regions 44 subsequent to activation of the rows of the memory regions (e.g., improved row address strobe, RAS, to column address strobe, CAS, delay, or tRCD) due at least to the increase in activation transistors to increase the rate of sensing of the memory device 10, as well as increases to the LIO equalization and providing better tCCDL timing (e.g., column to column cycling timings), and array efficiency (e.g., area of the die using memory cells relative to the die area).

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:
1. A memory device, comprising:
 a memory partition of the memory device, wherein the memory partition comprises:
  a memory region comprising a memory element coupled to a wordline of the memory region;
  a sense amplifier region comprising a sense amplifier coupled to the memory element to sense a data state of the memory element;
  a sub-wordline region coupled to the wordline of the memory region; and a minigap region disposed at an intersection of the sub-wordline region and the sense amplifier region, wherein the minigap region comprises:
  a first plurality of transistors having a continuous layout in at least one direction across the minigap region with a second plurality of transistors of the sense amplifier region.

2. The memory device of claim 1, wherein the first plurality of transistors have common pitch rules with the second plurality of transistors.

3. The memory device of claim 1, wherein a first transistor of the first plurality of transistors when in operation provides a voltage to at least one portion of the sense amplifier.

4. The memory device of claim 3, wherein a second transistor of the first plurality of transistors when in operation couples at least one second portion of the sense amplifier to ground.

5. The memory device of claim 4, wherein a third transistor of the first plurality of transistors when in operation provides a second voltage to an amplifier disposed in the minigap region.

6. The memory device of claim 5, wherein a fourth transistor of the first plurality of transistors when in operation provides an equalization voltage to at least one third portion of the sense amplifier.

7. The memory device of claim 1, wherein a first transistor of the first plurality of transistors is disposed in a sub-region of the sense amplifier region.

8. The memory device of claim 7, wherein the first transistor is a portion of an inverter of the sense amplifier.

9. The memory device of claim 8, wherein a second transistor of the second plurality of transistors is disposed in the minigap region.

10. The memory device of claim 9, wherein the second transistor is coupled to the sense amplifier, wherein the second transistor when in operation provides an activation voltage to the sense amplifier.

11. The memory device of claim 10, wherein the second transistor is disposed in a region of the minigap region directly adjacent to the sub-region of the sense amplifier along the at least one direction.

12. A device, comprising:
  a sense amplifier region comprising a sense amplifier coupled to a memory element to sense a data state of the memory element;
  a sub-wordline region coupled to the memory element via a wordline that accesses the memory element; and
  a minigap region disposed at an intersection of the sub-wordline region and the sense amplifier region, wherein the minigap region comprises:
    a first plurality of transistors having a first set of physical characteristics, wherein the first set of physical characteristics are present in a second plurality of transistors of the sense amplifier region; and
    a third plurality of transistors having a second set of physical characteristics, wherein the second set of physical characteristics are present in a fourth plurality of transistors of the sense amplifier region.

13. The device of claim 12, wherein the first plurality of transistors are aligned with the second plurality of transistors in a first direction.

14. The device of claim 13, wherein the third plurality of transistors are aligned with the fourth plurality of transistors in the first direction.

15. The device of claim 14, wherein the first plurality of transistors comprise at least a portion of the sense amplifier.

16. The device of claim 15, wherein the second plurality of transistors comprise at least one activation device to provide a voltage signal to the sense amplifier.

17. The device of claim 16, wherein the third plurality of transistors comprise at least a second portion of the sense amplifier.

18. The device of claim 17, wherein the second plurality of transistors comprise at least a third portion of an equalization device.

19. A method, comprising:
  configuring a first plurality of transistors having a first set of physical characteristics in a first portion of a sense amplifier region of a memory device;
  configuring a second set of transistors having the first set of physical characteristics in a second portion of a minigap region of the memory device, wherein the second portion of the minigap region is disposed directly adjacent to the first portion of the sense amplifier region in a direction, wherein the minigap region is disposed at an intersection of the sense amplifier region and a sub-wordline region of the memory device;
  configuring a third plurality of transistors having a second set of physical characteristics in a third portion of the sense amplifier region of the memory device; and
  configuring a fourth set of transistors having the second set of physical characteristics in a fourth portion of the minigap region of the memory device, wherein the fourth portion of the minigap region is disposed directly adjacent to the third portion of the sense amplifier region in the direction.

* * * * *